United States Patent
Jeong et al.

(10) Patent No.: US 9,899,100 B2
(45) Date of Patent: Feb. 20, 2018

(54) ONE TIME PROGRAMMABLE (OTP) CELL AND AN OTP MEMORY ARRAY USING THE SAME

(71) Applicant: Magnachip Semiconductor, Ltd., Cheongju-si (KR)

(72) Inventors: Duk Ju Jeong, Seoul (KR); Su Jin Kim, Cheonan-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/599,241

(22) Filed: May 18, 2017

(65) Prior Publication Data
US 2017/0372790 A1    Dec. 28, 2017

(30) Foreign Application Priority Data
Jun. 22, 2016    (KR) .................. 10-2016-0077869

(51) Int. Cl.
| | |
|---|---|
| G11C 17/00 | (2006.01) |
| G11C 17/16 | (2006.01) |
| H01L 23/525 | (2006.01) |
| H01L 29/49 | (2006.01) |
| H01L 27/112 | (2006.01) |
| H01L 49/02 | (2006.01) |
| H01L 23/528 | (2006.01) |
| G11C 17/18 | (2006.01) |
| H01L 29/423 | (2006.01) |

(52) U.S. Cl.
CPC ............ *G11C 17/165* (2013.01); *G11C 17/18* (2013.01); *H01L 23/528* (2013.01); *H01L 23/5252* (2013.01); *H01L 27/11206* (2013.01); *H01L 28/40* (2013.01); *H01L 29/42368* (2013.01); *H01L 29/4975* (2013.01)

(58) Field of Classification Search
CPC ........................... G11C 16/0466; G11C 16/10
See application file for complete search history.

(56) References Cited

U.S. PATENT DOCUMENTS

| | | | |
|---|---|---|---|
| 8,513,770 B2 | 8/2013 | Shin et al. | |
| 2002/0028541 A1* | 3/2002 | Lee .................... | G11C 16/3427 438/149 |
| 2003/0139010 A1* | 7/2003 | Wang .................... | H01L 27/105 438/257 |
| 2005/0041507 A1* | 2/2005 | Otsuka .................. | G11C 17/16 365/225.7 |
| 2005/0237797 A1* | 10/2005 | Jeng .................... | G11C 16/0475 365/185.01 |
| 2015/0221371 A1* | 8/2015 | Milani ............... | G11C 16/0408 365/185.28 |
| 2017/0110512 A1* | 4/2017 | Chung ................ | H01L 27/2454 |

* cited by examiner

*Primary Examiner* — Tuan T Nguyen
(74) *Attorney, Agent, or Firm* — NSIP Law

(57) ABSTRACT

An anti-fuse device includes a gate insulating film formed on a semiconductor substrate, a gate electrode formed on the gate insulating film, and a salicide layer formed on a first portion of the gate electrode such that a second portion of the gate electrode omits the salicide layer, wherein a hard breakdown of at least a portion of the gate insulating film at a time of programming the anti-fuse device.

24 Claims, 6 Drawing Sheets

ONE TIME PROGRAMMABLE (OTP) CELL AND AN OTP MEMORY ARRAY USING THE SAME

CROSS-REFERENCE TO RELATED APPLICATIONS

This application claims the benefit under 35 USC 119(a) of Korean Patent Application No. 10-2016-0077869 filed on Jun. 22, 2016 in the Korean Intellectual Property Office, the entire disclosure of which is incorporated herein by reference for all purposes.

BACKGROUND

1. Field

The following description relates to a one time programmable (OTP) cell. The following description also relates to an OTP cell with improved reliability and programming stability.

2. Description of Related Art

As is known, a non-volatile one time programmable (OTP) memory has the characteristic that information stored therein does not disappear even under power-off condition. For this reason, the OTP memory has firmly established its position as an essential element of a modern semiconductor integrated circuit device. Such an OTP memory has multiple cells, each one of which constitutes a unit cell of the memory, referred to as an "OTP cell." Such an OTP cell may also be used for various purposes other than forming a non-volatile memory. For example, a few OTP cells may be utilized to tune or trim parameters of an analog circuit device, or to set operational parameters in devices such as a microcontroller and a microprocessor. Furthermore, the OTP cells may also be utilized for the purpose of permanently storing a relatively small number of data bits such as identification data of an integrated circuit chip, a code of an encryption key, and information for management.

For example, the OTP cell may generally be realized in structures including a charge storage type, a capacitor type, a fuse, or an anti-fuse. Among these, the anti-fuse type is known to be initially in a non-conductive state and to become conductive when programmed, unlike the fuse, which operates in the opposite way. To program the anti-fuse structure, a high dielectric field is applied to a dielectric material such as an oxide to allow a tunneling current to flow through the dielectric material. The flow of the tunneling current through the dielectric material causes a phenomenon called "dielectric breakdown." If dielectric breakdown occurs in this manner, a conductive path through the dielectric material is formed, and accordingly, the anti-fuse becomes conductive.

Various implementations of an anti-fuse type OTP cell are known. Most of such implementations have a metal-oxide-semiconductor (MOS) transistor structure including a gate insulating film and a gate electrode formed on a semiconductor substrate. In such an MOS transistor structure, a portion to which a program voltage for programming is applied and in which dielectric breakdown actually occurs is a low voltage (LV) transistor area. If the dielectric breakdown occurs in the LV transistor area, a p-well is shorted, and a current path is formed between the gate electrode and the p-well. Such a current path formed in this way may be modeled using an equivalent resistance having a blowing resistance value. However, in some cases, the current path between the gate electrode and the p-well may be narrowly formed, and the equivalent resistance of the respective path may accordingly have a large blowing resistance value. Such a case is referred to as a case where soft breakdown has occurred. If the soft breakdown situation occurs as a result of programming the OTP cell, a problem arises that it is difficult to distinguish whether the respective OTP cell is a programmed cell or an unprogrammed cell when reading the OTP cell.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an anti-fuse device includes a gate insulating film formed on a semiconductor substrate, a gate electrode formed on the gate insulating film, and a salicide layer formed on a first portion of the gate electrode such that a second portion of the gate electrode omits the salicide layer, wherein a hard breakdown of at least a portion of the gate insulating film occurs at a time of programming the anti-fuse device.

The gate electrode may include a body portion and a protrusion extending from the body portion, and the gate insulating film may include a first gate insulating film and a second gate insulating film.

The first gate insulating film may be formed below the body portion of the gate electrode and a portion of the protrusion of the gate electrode, and the second gate insulating film may be formed below a remaining portion of the protrusion.

The first gate insulating film may have a first thickness, and the second gate insulating film may have a second thickness that is less than the first thickness.

The second portion of the gate electrode may include a portion of the gate electrode corresponding to a transistor area of the anti-fuse device, and at least part of a portion of the gate electrode corresponding to a capacitor area of the anti-fuse device.

The anti-fuse device may further include a contact formed on the salicide layer, wherein the second portion of the gate electrode is separated from the contact so that a minimum design rule requirement is met between the second portion of the gate electrode and the contact.

The anti-fuse device may further include a non-salicide layer formed on the second portion of the gate electrode.

In another general aspect, a one time programmable (OTP) memory array includes OTP cells arranged in rows and columns, wherein each of rows of the OTP cells is connected to a bit line, and each of columns of the OTP cells is connected to a word line, wherein each of the OTP cells includes a selection transistor and an anti-fuse, and wherein each anti-fuse includes a gate insulating film formed on a semiconductor substrate, a gate electrode formed on the gate insulating film, the gate electrode comprising a body portion and at least one protrusion extending from the body portion, and a salicide layer formed on the body portion of the gate electrode but not on a portion of the protrusion of the gate electrode.

Each selection transistor may be an n-type metal-oxide-semiconductor field-effect transistor (MOSFET) or a p-type MOSFET.

Each anti-fuse may include an anti-fuse transistor connected to a compensation capacitor in parallel.

The OTP memory array may further include write modules connected to the respective rows of the OTP cells through the respective bit lines, read modules connected to the respective rows of the OTP cells through the respective bit lines, and an address decoder connected to the columns of the OTP cells through the respective word lines.

Each of the write modules may include two inverters and four transistors.

The selection transistor of each of the OTP cells may include a first terminal connected to the respective bit line, a control terminal connected to the respective word line, and a second terminal connected to the anti-fuse of the respective OTP cell.

Each of the OTP cells may be configured to be programmed in response to a write voltage being inputted into the first terminal of the respective selection transistor through the respective bit line and an enable signal being inputted into the control terminal of the respective selection transistor through the respective word line.

At the time of programming each of the OTP cells, a portion of the gate insulating film corresponding to the protrusion of the gate electrode of the anti-fuse of the respective OTP cell may be broken down.

The anti-fuses may be arranged in a staggered pattern on the semiconductor substrate.

In another general aspect, a non-volatile semiconductor storage device includes a write module configured to output a write voltage in response to a write command signal, a one time programmable (OTP) cell comprising an anti-fuse, comprising a gate insulating film and a gate electrode, and a selection transistor, the gate insulating film of the anti-fuse of the OTP cell being broken down in response to the write voltage being inputted to the OTP cell so that data is written to the OTP cell, and a read module configured to read data written in the OTP cell, wherein the anti-fuse includes a salicide layer formed on a first portion of the gate electrode such that a second portion of the gate electrode omits the salicide layer, and the selection transistor includes the salicide layer.

The read module may include a transmission gate and/or a sense amplifier.

The gate electrode may include a body portion and a protrusion extending from the body portion, and the gate insulating film may include a first gate insulating film and a second gate insulating film.

The first gate insulating film may be formed below the body portion of the gate electrode and a portion of the protrusion of the gate electrode, and the second gate insulating film may be formed below a remaining portion of the protrusion.

The first gate insulating film may have a first thickness, and the second gate insulating film may have a second thickness less than the first thickness.

The second portion of the gate electrode may include a portion of the gate electrode corresponding to a transistor area of the anti-fuse, and at least part of a portion of the gate electrode corresponding to a capacitor area of the anti-fuse.

The anti-fuse may further include at least one contact formed in a position on the salicide layer formed on the first portion of the gate electrode, and wherein the second portion of the gate electrode is separated from the position so that a minimum design rule requirement is met between the second portion of the gate electrode and the at least one contact.

The anti-fuse may further include a non-salicide layer formed on the second portion of the gate electrode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
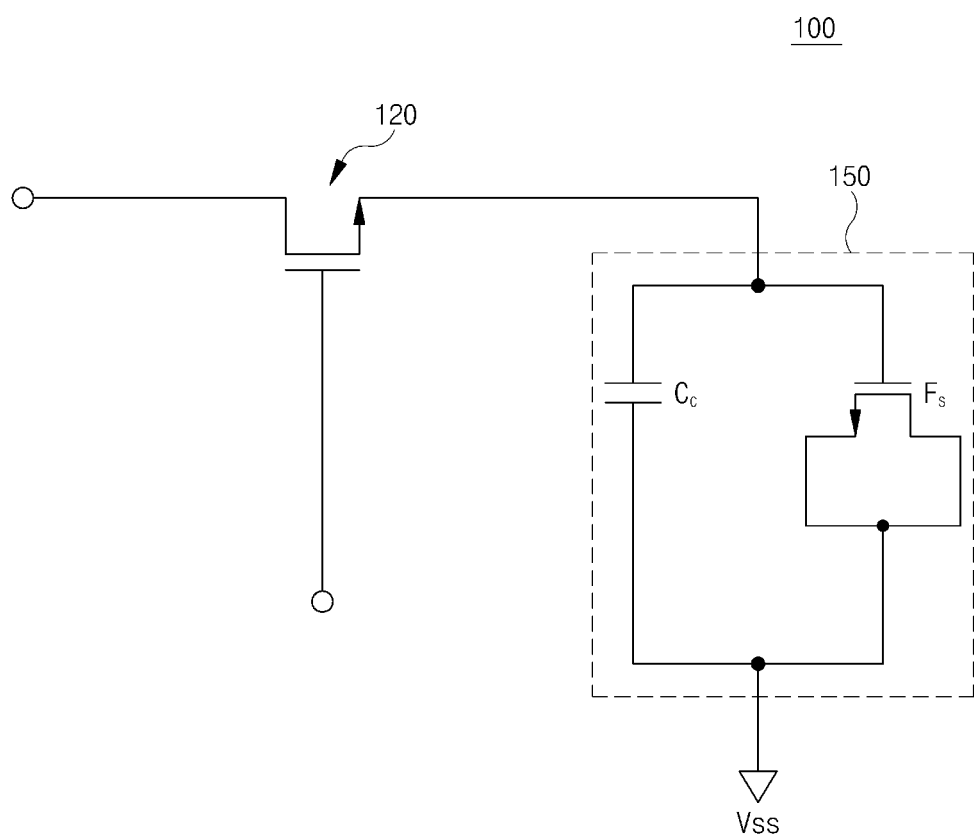
FIG. 1 is a view illustrating an example of an equivalent circuit of a one time programmable (OTP) cell.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

In this disclosure, various examples and implementations are described in further detail to provide a one time programmable (OTP) cell and an OTP memory array using such a cell. Examples are described in more detail below with reference to the appended drawings. Elements illustrated in the drawings are merely illustrated in sizes relative to those of other elements for convenience, and it is to be understood that actual sizes of the elements may be substantially different from those illustrated in the drawings.

FIG. 1 is a view illustrating an example of an equivalent circuit of an OTP cell.

As illustrated in the example of FIG. 1, an OTP cell 100 includes a selection transistor 120 and an anti-fuse 150 serially connected to the selection transistor 120. For example, the selection transistor 120 may be an n-type metal-oxide-semiconductor field-effect transistor (MOSFET) or a p-type MOSFET. In a case in which the selection transistor 120 is implemented as an n-type MOSFET, as shown in the illustrated example of FIG. 1, a drain terminal of the selection transistor 120 is connected to a path to which a program voltage is applied, such as a bit line BL of a memory array circuit, and a source terminal of the selection transistor 120 is connected to the anti-fuse 150. Additionally, a gate terminal of the selection transistor 120 is connected to a line to which an enable signal is applied, such as a word line WL of a memory array circuit.

In the example of FIG. 1, the anti-fuse 150 includes a compensation capacitor Cc and an anti-fuse transistor Fs connected to the compensation capacitor Cc in parallel. For example, one terminal of the compensation capacitor Cc is connected to the source terminal of the selection transistor 120, and the other terminal of the compensation capacitor Cc is connected to a ground voltage Vss to be grounded. Furthermore, in this example, the source and drain terminals of the anti-fuse transistor Fs are connected to each other and are grounded together with the compensation capacitor Cc. Although the anti-fuse transistor Fs is illustrated as an n-type MOSFET in the example of FIG. 1, the anti-fuse transistor Fs may also alternatively be implemented as a p-type MOSFET. However, these are only examples and other structures may be used to form the anti-fuse transistor Fs.

In an example in which a write voltage is applied to the drain terminal of the selection transistor 120 and an enable signal is applied to the gate terminal of the selection transistor 120, a path is formed between the drain and source of the selection transistor 120 to allow a predetermined voltage to be applied to the gate of the anti-fuse 150. In response, a gate insulating film of the anti-fuse 150 is broken down and a current path is formed accordingly through the anti-fuse 150. As a result, the anti-fuse 150 is able to serve as a conductive path having an arbitrary resistance value. In this example, the anti-fuse 150 is said to have been programmed, and the corresponding resistance value of the conductive path is referred to as a blowing resistance value. In an example, to facilitate breakdown of the gate insulating film of the anti-fuse transistor Fs even under the application of a relatively low voltage, a thickness of the gate insulating film is accordingly formed smaller than a typical thickness. In an example, the anti-fuse transistor Fs is implemented using a low voltage (LV) transistor area in a semiconductor substrate. According to examples, the anti-fuse transistor Fs is designed so that hard breakdown occurs when more than a predetermined level of voltage is applied to the anti-fuse transistor Fs. In this example, a blowing resistance value of a formed current path is accordingly lower than in an alternative anti-fuse transistor.

In an example, the compensation capacitor Cc is implemented using a thicker gate insulating film than the gate insulating film of the anti-fuse transistor Fs on the semiconductor substrate. For this reason, the compensation capacitor Cc is potentially designed to occupy a medium voltage (MV) transistor area on the semiconductor substrate. In such an example, the compensation capacitor Cc accumulates charge as a predetermined voltage is supplied to the compensation capacitor Cc. Thus, the compensation capacitor Cc uses the accumulated charge to cause a voltage pumping effect to continuously apply a high voltage corresponding to the above-mentioned predetermined voltage or a higher voltage to the gate insulating film of the anti-fuse transistor Fs, that is, the LV transistor area, thereby facilitating dielectric breakdown.

Figure 2:
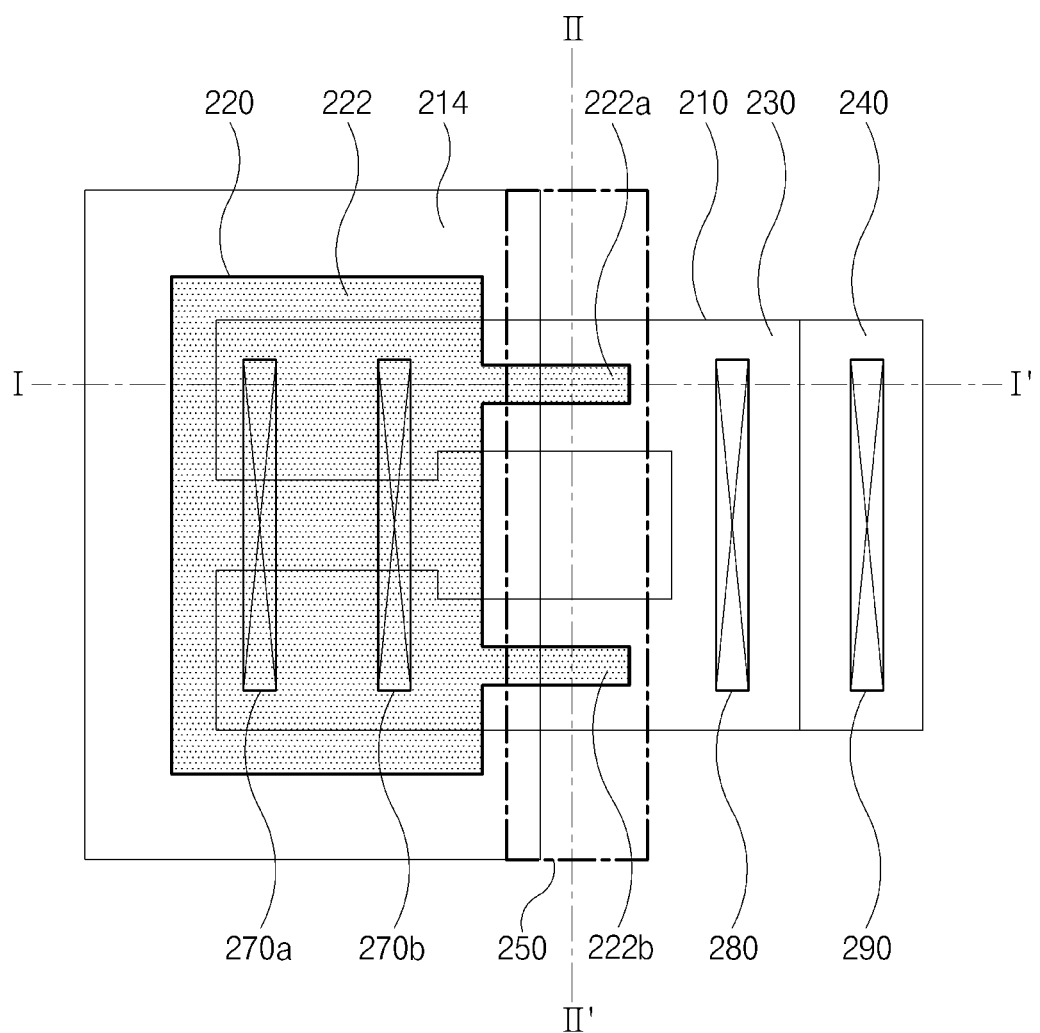
FIG. 2 is a view illustrating an example of a layout diagram of the anti-fuse of FIG. 1.
Figure 3:
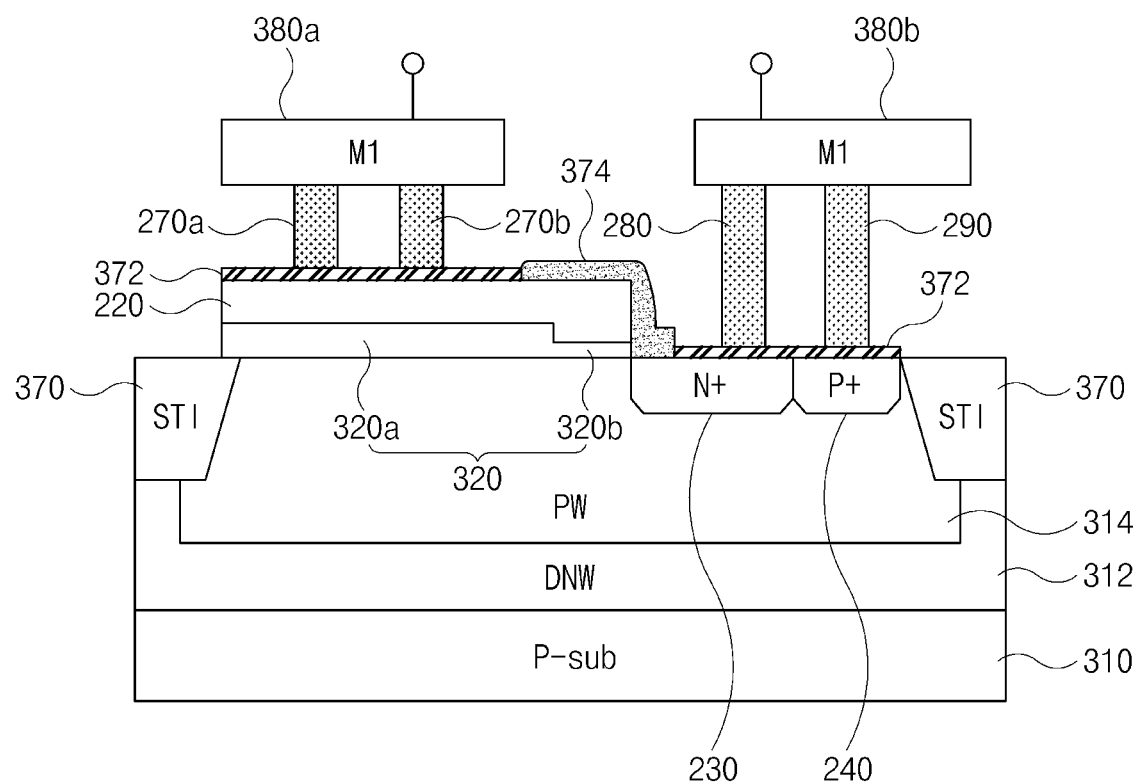
FIG. 3 is a view illustrating an example of a cross-sectional view of the anti-fuse of FIG. 2 taken along line I-I'.
Figure 4:
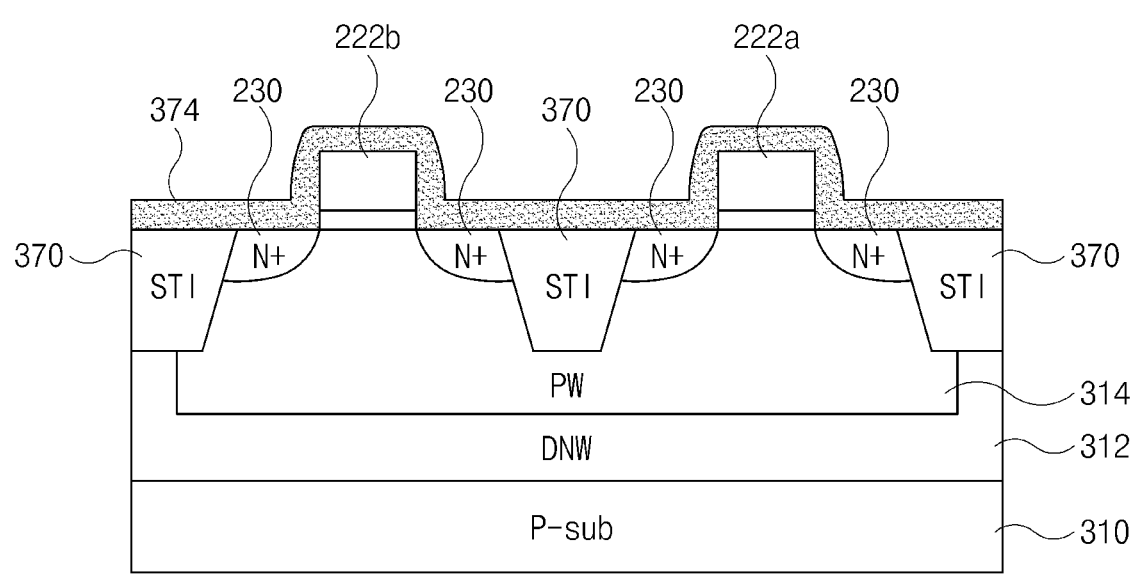
FIG. 4 is a view illustrating an example of a cross-sectional view of the anti-fuse of FIG. 2 taken along line II-II'.

FIG. 2 is a view illustrating an example of a layout diagram of the anti-fuse of FIG. 1. FIG. 3 is a view illustrating an example of a cross-sectional view of the anti-fuse of FIG. 2 taken along line I-I'. FIG. 4 is a view illustrating an example of a cross-sectional view of the anti-fuse of FIG. 2 taken along line II-II'. Subsequently, a configuration of the anti-fuse according to the examples is described in further detail with reference to FIGS. 2 to 4.

As illustrated, according to the examples of FIGS. 2-4, the anti-fuse 150 includes a gate insulating film 320 formed on a semiconductor substrate 310. In an example, the semiconductor substrate 310 is a bulk substrate or a silicon-on-insulator (SOI) substrate. In such an example, a semiconductor layer of the semiconductor substrate 310 is formed of materials such as Si, Ge, SiGe, GaP, GaAs, SiC, SiGeC, InAs, or InP. However, these are only examples, and the semiconductor substrate 310 optionally includes other similar semiconductor materials. According to FIGS. 3-4, the semiconductor substrate 310 includes a well 314, and the well 314 is formed on a deep n-well (DNW) 312 that is interposed between the well 314 and the semiconductor substrate 310, as illustrated in FIGS. 3-4. For example, the well 314 is formed by injecting specific conductive ions from above the semiconductor substrate 310. In an example, the well 314 is a p-well formed by injecting p-type ions, as illustrated. However, this is only an example, and other types of well 314 are formed in different manners. For example, the gate insulating film 320 is formed on the well 314 of the semiconductor substrate 310 and is formed using an oxide film, a nitride film, an oxide nitride film, a metal oxide film, or a film with the oxide film, the nitride film, the oxide nitride film, and the metal oxide film being laminated in multiple layers. For example, the gate insulating film 320 includes a first gate insulating film 320a corresponding to a capacitor area in which the compensation capacitor Cc is formed, such as shown at reference numeral 214 in FIG. 2, and a second gate insulating film 320b corresponding to a transistor area in which the anti-fuse transistor Fs is formed. In an example, the first gate insulating film 320a and the second gate insulating film 320b are integrally formed together using the same material. In another embodiment, the first gate insulating film 320a and the second gate insulating film 320b may be separately formed using materials identical to or different from each other. The first gate insulating film 320a and the second gate insulating film 320b may be formed to have different thicknesses, such as shown in FIG. 3. For example, the gate insulating film 320 is formed in a stepped manner so that the first gate insulating film 320a has a first thickness and the second gate insulating film 320b has a second thickness smaller than the first thickness. In this manner, breakdown or blowing of the gate insulating film 320 is facilitated even with a relatively low program voltage. However, it is to be noted that the thickness of the gate insulating film 320 does not necessarily have to be formed differently for each area.

In the examples of FIGS. 2-4, the anti-fuse 150 further includes a gate electrode 220 applied on the gate insulating film 320. As is known in the art, the gate electrode 220 is potentially formed using materials such as polysilicon and metal. As illustrated in the example of FIG. 2, the gate electrode 220 has a body portion 222 and two protrusions 222a and 222b extending from the body portion 222. The body portion 222 is formed on a portion of the first gate insulating film 320a in the capacitor area, and the protrusions 222a and 222b are formed on the remaining portion of the first gate insulating film 320a in the capacitor area and the second gate insulating film 320b in the transistor area. In other words, the first gate insulating film 320a in the capacitor area is formed below the body portion 222 and the portions of the protrusions 222a and 222b adjacent to the body portion 222, and the second insulating film 320b in the transistor area are formed below the remaining portions of the protrusions 222a and 222b. With the two protrusions 222a and 222b, it is possible to improve blowing yield. That is, by providing the two protrusions 222a and 222b, it is possible to ensure that even if one of the two protrusions 222a and 222b undergoes failure, that is, a soft breakdown, hard breakdown occurs in the other one to provide a conductive path. In an example, the gate electrode 220 has a doping type opposite to the doping type of the well 314 of the semiconductor substrate 310. That is, the gate electrode 220 is doped with n-type ions when the well 314 of the semiconductor substrate 310 is a p-type well, and the gate electrode 220 is doped with p-type ions when the well 314 is an n-type well. In another example, doping of the gate electrode 220 is omitted.

In the examples of FIGS. 2-4, the anti-fuse 150 further includes a doped area 230 formed in a manner that surrounds the protrusions 222a and 222b of the gate electrode 220 in an active area 210 and a well tab area 240, formed to abut the doped area 230. For example, the doped area 230 is formed in the well 314 by injecting ions of the same type as the doping type of the gate electrode 220. Thus, as in the example of the gate electrode 220, the doped area 230 has a doping type opposite to that of the doping type of the well 314. While the well-314 is a p-type well in the illustrated example, and thus the doped area 230 is formed by injecting n-type ions, the doping type of the doped area 230 is not limited to this particular example. For example, if the well 314 is an n-type well, the doped area 230 is formed by injecting p-type ions. In such an example, the well tab area 240 is used for applying a bias voltage such as a DC 0V bias voltage and is formed by more densely injecting ions of the same type as the ions for use in forming the well 314. Since the well 314 is a p-type well in the illustrated example, the well tab area 240 is accordingly a p+ type in such an example.

In the example of FIGS. 2-4, the first protrusion 222a and the second protrusion 222b are separated from each other by a separation film 370, such as a shallow trench isolation (STI) structure. In such an example, the separation film 370 is formed by forming a trench on the semiconductor substrate 310 and filling an insulating film, such as silicon oxide, in the trench. Although the shallow trench isolation STI is used as the separation film 370 in the illustrated example, it is to be noted that types of the separation film 370 according to the present examples are not limited to the shallow trench isolation STI and other appropriate materials and structures are used in other examples as the separation film 370. Because the separation film 370 is disposed between the two protrusions 222a and 222b, even if any one of the gate insulating films, which correspond to the two protrusions 222a and 222b, that is, are laid below the two protrusions 222a and 222b, is blown first when programming the anti-fuse 150, the gate insulating film being blown first does not have a negative influence on a blowing operation of the remaining gate insulating film. Accordingly, even if soft breakdown occurs in a gate insulating film below one protrusion, blowing is still smoothly performed because hard breakdown occurs in a gate insulating film below the other protrusion. Each of the gate insulating films corresponding to the protrusions 222a and 222b includes the gate insulating film 320b in the transistor area and a portion of the gate insulating film 320a in the capacitor area.

In an example, the anti-fuse 150 further includes a self-aligned silicide layer or salicide layer formed on a portion of the gate electrode 220 and a non-salicide layer formed on the remaining portion of the gate electrode 220. In such an example, the anti-fuse 150 also further includes a salicide layer formed on a portion of the doped area 230 and the well tab area 240. Also, the anti-fuse 150 further includes a non-salicide layer formed on the remaining portion of the doped area 230. In an example, the salicide layer is formed using materials such as Ti, Co, Ni, Pt, and W. However, these are only examples and in other examples other appropriate materials are used for the salicide layer. In an example, the non-salicide layer is an insulator formed with an oxide-based material or a nitride-based material. However, these are only examples and in other examples other appropriate insulators are used as the non-salicide layer. In an example, the gate electrode 220 is applied with a non-salicide layer. In such an example, a portion of the non-salicide layer, applied on a portion in which a salicide layer is to be formed, is removed by an etching process, and a salicide layer is formed in the removed portion.

It is known in the art that if the salicide layer is formed on a gate, a source, and a drain of a MOS transistor, in particular, a MOS transistor of a submicron structure, such a technique is able to decrease resistance of the corresponding transistor. For this reason, in examples, the salicide layer is effective for forming an electrical contact between a MOS transistor and a related wiring structure. However, if the salicide layer is formed on the protrusions 222a and 222b of the gate electrode 220, breakdown occurs in the form of soft breakdown in a narrow area of a gate insulating film in a fuse area while programming the OTP cell 100. Thus a blowing resistance value is possibly extremely large even if a current path is formed in the fuse area. If a reliability test referred to as a "hot temperature stress test" (HTST) is carried out on an OTP cell whose gate insulating film has been broken down in the form of a soft breakdown, the blowing resistance value of the OTP cell accordingly increases further to a degree that the corresponding OTP cell turns out to be an unprogrammed cell. Thus, if a read operation is performed on the OTP cell that has gone through the HTST test, a read result is obtained, as if the programmed cell is unprogrammed, and thus the programmed cell is decided to have failed in programming. According to statistical research, such a failure decision occurs at the parts-per-million (ppm) level even though the frequency of occurrence of failure decisions is not such a high level.

According to the present examples, instead of forming a salicide layer on an entire portion of the gate electrode 220, the salicide layer is selectively formed only on a portion of the gate electrode 220 in which the contact is formed, and a non-salicide layer is formed on the other portions. In this manner, when programming the anti-fuse 150, a probability of an occurrence of hard breakdown of the gate insulating films corresponding to the protrusions 222a and 222b is able to be considerably increased. For example, an area in which salicide blocking is applied to form a non-salicide layer is marked with a reference numeral 250 in FIG. 2, and the salicide layer and the non-salicide layer are respectively marked with reference numerals 372 and 374 in FIGS. 3 and 4.

In the examples of FIGS. 2-4, the anti-fuse 150 further includes one or more gate contacts 270a and 270b formed at predetermined positions on the salicide layer 372 formed on a portion of the gate electrode 220. Such an anti-fuse 150 further includes a source contact 280 formed on the salicide layer 372 formed on a portion of the doped area 230. In these examples, the anti-fuse 150 further includes a well tab contact 290 formed on the salicide layer 372, that in turn is formed on the well tab area 240. Additionally, a metal layer 380a for receiving a voltage for breaking down the gate insulating films corresponding to the protrusions 222a and 222b is formed on the gate contacts 270a and 270b. For example, a metal layer 380b grounded to 0V is formed on the source contact 280 and the well tab contact 290. In such an example, the metal layer 380a and the metal layer 380b are spaced a predetermined distance apart from each other.

At least one of the gate contacts 270a and 270b, the source contact 280, and the well tab contact 290 is formed to occupy the largest possible area on the gate electrode 220, the doped area 230, and the well tab area 240, respectively. For example, the contacts are potentially formed in a symmetrical quadrilateral shape, but if so formed, they would occupy a large area in the overall layout. Furthermore, for the gate contacts 270a and 270b, a more serious problem potentially arises, in that power, that is, a program voltage for blowing, is possibly not smoothly supplied to the gate electrode 220 below the gate contacts 270a and 270b. Consequently, to efficiently utilize layout space, and at the same time, ensure sufficient and stable power delivery, one or more of (i) at least one of the gate contacts 270a and 270b, (ii) the source contact 280, and (iii) the well tab contact 290 is possibly designed to have a quadrilateral shape with a large width, instead of a symmetrical quadrilateral shape.

In the example of FIGS. 2-4, the salicide blocking area 250, that is, the remaining portion of the gate electrode 220 on which the non-salicide layer 374 is formed, is spaced apart from the positions, at which the at least one of the gate contacts 270a and 270b are formed, so that a minimum design rule requirement is met between the salicide blocking area 250 and the at least one of the gate contacts 270a and 270b. If only one contact is formed on the gate electrode 220, the salicide blocking area 250 is designed to cover all of the protrusions 222a and 222b, and depending on the chip design, to be extended even to a portion of the body portion 222. In an example, a portion of the gate electrode 220, on which the salicide layer 372 is formed, includes the body portion 222 and the portions of the protrusions 222a and 222b adjacent to the body portion 222. In other words, in such an example, the remaining portion of the gate electrode 220, on which the non-salicide layer 374 is formed, includes a portion of the gate electrode corresponding to the transistor area of the anti-fuse 150 and at least part of a portion of the gate electrode corresponding to the capacitor area of the anti-fuse 150. As illustrated in the examples of FIGS. 2 and 3, the non-salicide layer is formed to cover even a portion of the doped area 230 in some examples.

As described above, by applying salicide blocking to a portion of the gate electrode corresponding to the transistor area, breakdown, in particular hard breakdown, is able to occur in so wide an area of the gate insulating film below the protrusions 222a and 222b that a wide current path is formed. As a result, the associated blowing resistance is decreased. For the OTP cell whose blowing resistance has been formed to have a low resistance value, its blowing resistance value hardly increases even if the OTP cell goes through a reliability test such as the HTST. This effect is caused because the widely formed current path remains with almost no change even when the OTP cell goes through the reliability test. Even if the current path slightly changes after the reliability test, the change is not significant enough to affect the blowing resistance value. Moreover, a stable read operation is possible on the OTP cell with a small blowing resistance value, even after the reliability test. That is, if a read operation is performed on the OTP cell 100 with a small blowing resistance value, it is possible to easily distinguish whether the respective OTP cell is a programmed cell or an unprogrammed cell.

Figure 5:
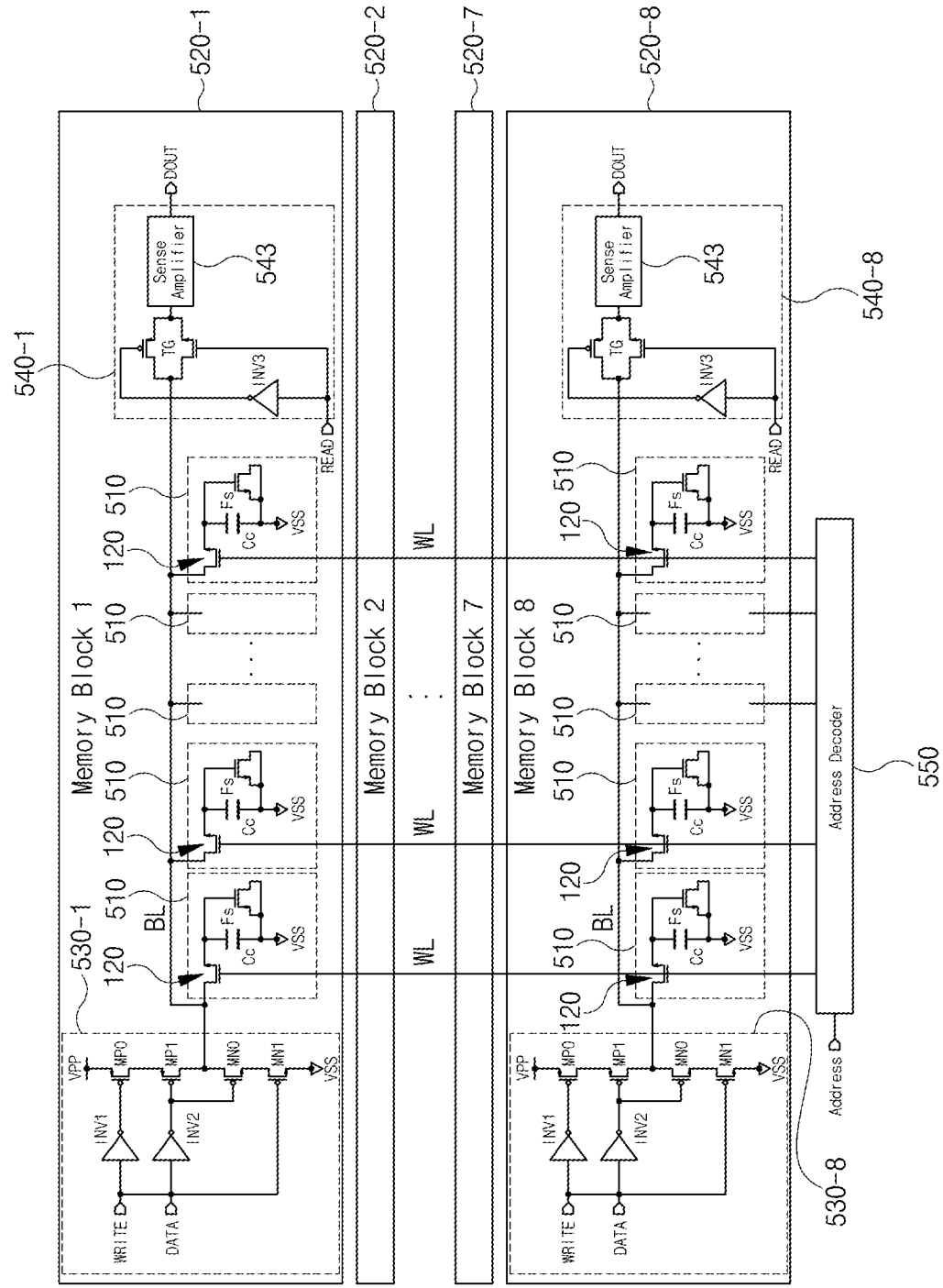
FIG. 5 is a view illustrating an example of a configuration of an OTP memory array formed using an OTP cell according to an example.

FIG. 5 is a view illustrating an example of a configuration of an OTP memory array formed using an OTP cell according to an example.

Referring to the example of FIG. 5, an OTP memory array 500 includes a plurality of OTP cells 510 arranged in rows and columns or in the form of a cross-point array. The plurality of OTP cells 510 are each an OTP cell according to the examples including the selection transistor 120 and the anti-fuse 150, as described in conjunction with the examples of FIGS. 1 to 4. Each of the rows of the plurality of OTP cells 510 forms a single memory block. The OTP cells 510 belonging to a respective row are connected to a respective bit line BL. That is, a drain terminal of the selection transistor 120 of each of the OTP cells 510 belonging to each of the memory blocks 520-1 to 520-8 is connected to the bit line BL. Each of the columns of the plurality of OTP cells 510 is connected to a respective word line WL. That is, in such an example, gate terminals of the selection transistor 120 of each of the OTP cells 510 belonging to the same column are connected to the word line WL.

For example, the OTP memory array 500 further includes write modules 530-1 to 530-8, each being connected to a respective one of the rows of the plurality of OTP cells 510 through the respective bit line BL. Each of the write modules 530-1 to 530-8 is configured to respond to a write command signal (WRITE) to supply a write voltage corresponding to write data to the drain terminals of the selection transistors 120 of the OTP cells 510 included in the respective column through the respective bit line BL. In such an example, the write voltage has a voltage level of logic '0' or a voltage level of logic '1' that is lower than a program voltage Vpp by a predetermined voltage level. In an example, each of the write modules 530-1 to 530-8 includes inverters INV1 and INV2 and four MOS transistors MP0, MP1, MN0, and MN1.

When a write command signal (WRITE) of logic 1 and write data of logic 1 are inputted into the write modules 530-1 to 530-8, the outputs of the inverters INV1 and INV2 all become logic 0, with the result that the p-type MOS transistors MP0 and MP1 are turned on while the n-type MOS transistors MN0 and MN1 are turned off. Accordingly, a voltage lower than the program voltage Vpp by voltage drops between the sources and drains of the p-type MOS transistors MP0 and MP1, that is, the write voltage having a voltage level of logic 1 is supplied through the bit line BL to the drain terminal of the selection transistor 120 of each of the OTP cells 510 belonging to the respective row. By contrast, when a write command signal (WRITE) of logic 1 and write data of logic 0 are inputted to the write modules 530-1 to 530-8, the output of the inverter INV1 becomes logic 0, and the output of the inverter INV2 becomes logic 1, with the result that the p-type MOS transistor MP1 is turned off while the n-type MOS transistors MN0 and MN1 are turned on. Accordingly, the voltage Vss, which may be DC 0V, that is, a voltage level of logic 0, is supplied through the bit line BL into the drain terminal of the selection transistor 120 of each of the OTP cells 510 belonging to the respective row. Meanwhile, when a write command signal (WRITE) of logic 0 is inputted into the write modules 530-1 to 530-8, both the p-type MOS transistor MP0 and the n-type MOS transistor MN1 are turned off such that no signal is transmitted to the bit line BL.

In the example of FIG. 5, the OTP memory array 500 further includes an address decoder 550, connected to the columns of the plurality of OTP cells 510 through the respective word lines WL. In such an example, the address decoder 550 is configured to decode an address signal and to supply an enable signal to a selected one of the word lines WL. Each of the OTP cells 510 is programmed in response to an enable signal being inputted into the gate terminal of the respective selection transistor 120 through the respective word line WL and a write voltage being inputted into the drain terminal of the respective selection transistor 120 through the respective bit line BL. Thus, if a write voltage corresponding to a voltage level of logic 1 is inputted into the drain terminal of the selection transistor 120 of the OTP cell 510, a blowing operation occurs with regard to the respective OTP cell 510, that is, the gate insulating film below the protrusion of its anti-fuse is broken down, which makes the respective OTP cell 510 be programmed. On the other hand, if a write voltage corresponding to a voltage level of logic 0 is inputted into the drain terminal of the selection transistor 120 of the OTP cell 510, a blowing operation does not occur with regard to the OTP cell 510, and as a result, the OTP cell 510 is not programmed.

In the example of FIG. 5, the OTP memory array 500 further includes read modules 540-1 to 540-8, each being connected to a respective one of the rows of the plurality of OTP cells 510 through the respective bit line BL. For example, each of the read modules 540-1 to 540-8 is configured to respond to a read command signal (READ) to read data written to a selected one of the OTP cells 510 included in the respective row and whose selection transistor receives an enable signal through its gate terminal. Each of the read modules 540-1 to 540-8 includes an inverter INV3 for inverting a read command signal (READ) as inputted. Each of the read modules 540-1 to 540-8 includes a transmission gate TG configured to respond to the read command signal (READ) and an output signal from the inverter INV3 to output a signal at the drain terminal of the selection transistor 120 of a selected one of the OTP cells 510. In an example, the transmission gate TG is formed of an n-type MOS transistor and a p-type MOS transistor, as illustrated. Each of the read modules 540-1 to 540-8 further includes a sense amplifier 543 connected to the transmission gate TG and configured to convert a signal output from the sense amplifier 543 into a logic signal. If the read command signal (READ) is input to the read modules 540-1 to 540-8, and at the same time, the OTP cell 510, into which an enable signal is inputted through the word line WL, is connected to the bit line BL, the bit line BL is connected to the sense amplifier 543 through the transmission gate TG so that data can be read from the respective OTP cell 510. If a certain OTP cell is a programmed cell, a voltage at the drain terminal thereof has a voltage level of logic 0. As the voltage level of logic 0 is inputted to the sense amplifier 543 through the transmission gate TG, the respective OTP cell is considered to be a programmed cell.

Although the OTP memory array 500 has been shown and presented as including eight memory blocks in the above discussion, a plurality of banks each including the OTP memory array 500 of examples is arranged to form an OTP memory array of a larger scale. In this example, bank addresses capable of distinguishing the banks are assigned to the respective banks, and each bank address is used in association with write command signals and/or read command signals in the respective bank to control a data write/read operation.

Figure 6:
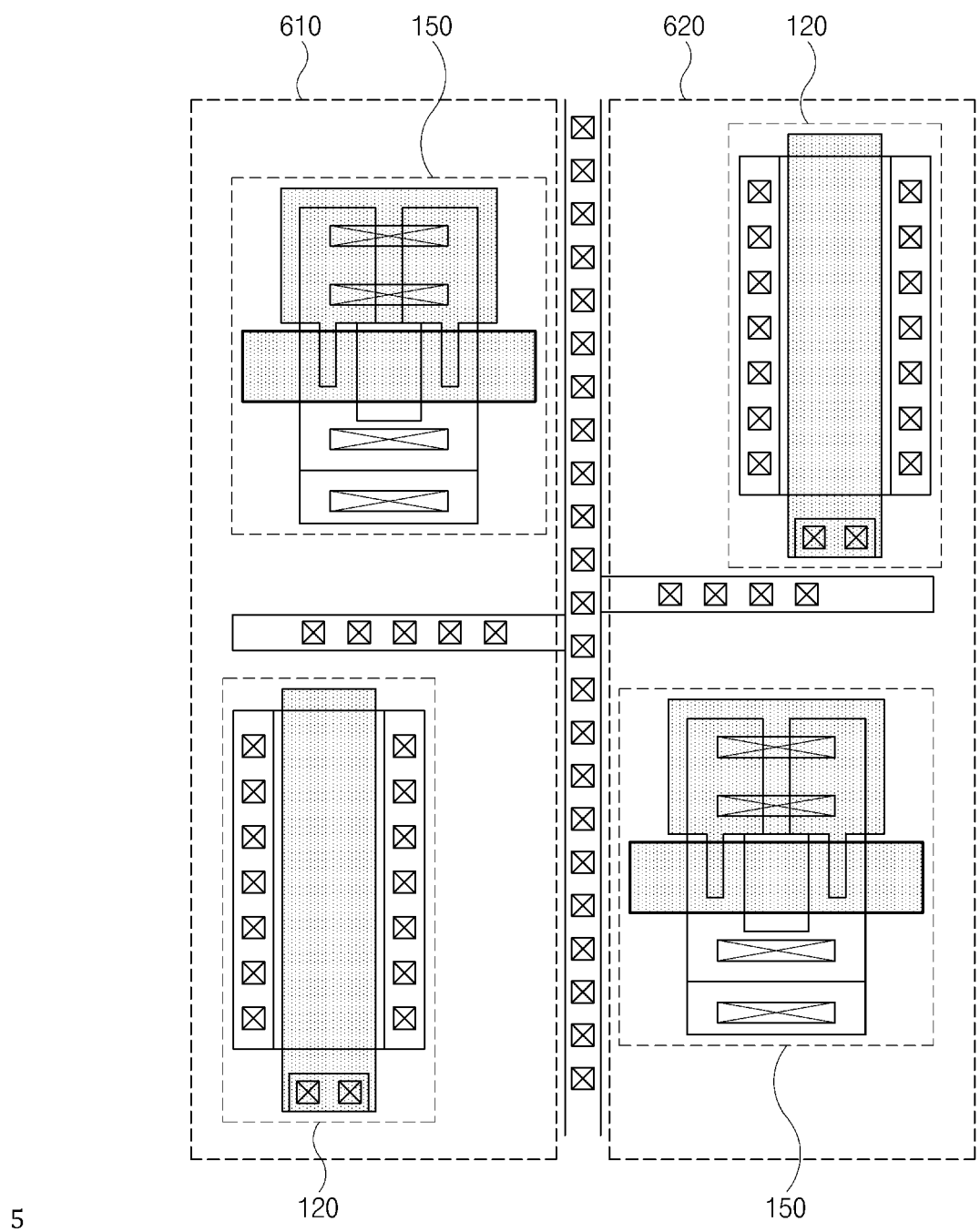
FIG. 6 is a view illustrating an example of a diagram to exemplify laying out OTP cells on a semiconductor substrate to form the OTP memory array of FIG. 5.

FIG. 6 is a view illustrating an example of a diagram to exemplify laying out OTP cells on a semiconductor substrate to form the OTP memory array of FIG. 5.

A layout of two OTP cells 610 and 620 is illustrated as an example in FIG. 6. As illustrated, the anti-fuse 150 is arranged at the upper area of the OTP cell 610 located on the left, and the selection transistor 120 is arranged at the lower area of the OTP cell 610 located on the left. By contrast, the selection transistor 120 is arranged at the upper area of the OTP cell 620 located on the right, and the anti-fuse 150 is arranged at the lower area of the OTP cell 620 located on the right. By arranging the anti-fuses 150 in a staggered pattern on the semiconductor substrate in this manner, interference between adjacent OTP cells is reduced. In an example, OTP cells are arranged so that the anti-fuses 150 of the OTP cells are aligned in the diagonal direction. Although only two OTP cells have been illustrated in FIG. 6, it is to be appreciated that the number of OTP cells to be arranged in the layout is not limited thereto, and other appropriate numbers of OTP cells are used in other examples.

According to examples disclosed herein, a probability of occurrence of hard breakdown is able to be increased in programming the OTP cell, thereby making it possible to program the OTP cell in a stable manner.

In the examples disclosed herein, the arrangement of the illustrated components possibly varies depending on an environment or requirements to be implemented. For example, some of the components may be omitted or several components may be integrated and carried out together. In addition, the arrangement order of some of the components can be changed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An anti-fuse device, comprising:
a gate insulating film formed on a semiconductor substrate;
a gate electrode formed on the gate insulating film; and
a salicide layer formed on a first portion of the gate electrode such that a second portion of the gate electrode omits the salicide layer, wherein a hard breakdown of at least a portion of the gate insulating film occurs at a time of programming the anti-fuse device.

2. The anti-fuse device of claim 1, wherein the gate electrode comprises a body portion and a protrusion extending from the body portion, and the gate insulating film comprises a first gate insulating film and a second gate insulating film.

3. The anti-fuse device of claim 2, wherein the first gate insulating film is formed below the body portion of the gate electrode and a portion of the protrusion of the gate electrode, and the second gate insulating film is formed below a remaining portion of the protrusion.

4. The anti-fuse device of claim 3, wherein the first gate insulating film has a first thickness, and the second gate insulating film has a second thickness that is less than the first thickness.

5. The anti-fuse device of claim 1, wherein the second portion of the gate electrode comprises a portion of the gate electrode corresponding to a transistor area of the anti-fuse device, and at least part of a portion of the gate electrode corresponding to a capacitor area of the anti-fuse device.

6. The anti-fuse device of claim 1, further comprising a contact formed on the salicide layer, wherein the second portion of the gate electrode is separated from the contact so that a minimum design rule requirement is met between the second portion of the gate electrode and the contact.

7. The anti-fuse device of claim 1, further comprising a non-salicide layer formed on the second portion of the gate electrode.

8. A one time programmable (OTP) memory array, comprising:
OTP cells arranged in rows and columns,
wherein each of rows of the OTP cells is connected to a bit line, and each of columns of the OTP cells is connected to a word line,
wherein each of the OTP cells comprises a selection transistor and an anti-fuse, and
wherein each anti-fuse comprises a gate insulating film formed on a semiconductor substrate, a gate electrode formed on the gate insulating film, the gate electrode comprising a body portion and at least one protrusion extending from the body portion, and a salicide layer formed on the body portion of the gate electrode but not on at least a portion of the protrusion of the gate electrode.

9. The OTP memory array of claim 8, wherein each selection transistor is an n-type metal-oxide-semiconductor field-effect transistor (MOSFET) or a p-type MOSFET.

10. The OTP memory array of claim 8, wherein each anti-fuse comprises a compensation capacitor and an anti-fuse transistor connected to the compensation capacitor in parallel.

11. The OTP memory array of claim 8, wherein the OTP memory array further comprises:
write modules connected to the respective rows of the OTP cells through the respective bit lines;
read modules connected to the respective rows of the OTP cells through the respective bit lines; and
an address decoder connected to the columns of the OTP cells through the respective word lines.

12. The OTP memory array of claim 8, wherein each of the write modules comprises two inverters and four transistors.

13. The OTP memory array of claim 8, wherein the selection transistor of each of the OTP cells comprises a first terminal connected to the respective bit line, a control terminal connected to the respective word line, and a second terminal connected to the anti-fuse of the respective OTP cell.

14. The OTP memory array of claim 13, wherein each of the OTP cells is configured to be programmed in response to a write voltage being inputted into the first terminal of the respective selection transistor through the respective bit line and an enable signal being inputted into the control terminal of the respective selection transistor through the respective word line.

15. The OTP memory array of claim 14, wherein at the time of programming each of the OTP cells, a portion of the gate insulating film corresponding to the protrusion of the gate electrode of the anti-fuse of the respective OTP cell is broken down.

16. The OTP memory array of claim 8, wherein the anti-fuses are arranged in a staggered pattern on the semiconductor substrate.

17. A non-volatile semiconductor storage device, comprising:
   a write module configured to output a write voltage in response to a write command signal;
   a one time programmable (OTP) cell comprising an anti-fuse, comprising a gate insulating film and a gate electrode, and a selection transistor, the gate insulating film of the anti-fuse of the OTP cell being broken down in response to the write voltage being inputted to the OTP cell so that data is written to the OTP cell; and
   a read module configured to read data written in the OTP cell,
   wherein the anti-fuse comprises a salicide layer formed on a first portion of the gate electrode such that a second portion of the gate electrode omits the salicide layer, and the selection transistor comprises the salicide layer.

18. The non-volatile semiconductor storage device of claim 17, wherein the read module comprises a transmission gate and/or a sense amplifier.

19. The non-volatile semiconductor storage device of claim 17, wherein the gate electrode comprises a body portion and a protrusion extending from the body portion, and the gate insulating film comprises a first gate insulating film and a second gate insulating film.

20. The non-volatile semiconductor storage device of claim 17, wherein the first gate insulating film is formed below the body portion of the gate electrode and a portion of the protrusion of the gate electrode, and the second gate insulating film is formed below a remaining portion of the protrusion.

21. The non-volatile semiconductor storage device of claim 20, wherein the first gate insulating film has a first thickness, and the second gate insulating film has a second thickness less than the first thickness.

22. The non-volatile semiconductor storage device of claim 17, wherein the second portion of the gate electrode comprises a portion of the gate electrode corresponding to a transistor area of the anti-fuse, and at least part of a portion of the gate electrode corresponding to a capacitor area of the anti-fuse.

23. The non-volatile semiconductor storage device of claim 17, wherein the anti-fuse further comprises at least one contact formed in a position on the salicide layer formed on the first portion of the gate electrode, and
   wherein the second portion of the gate electrode is separated from the position so that a minimum design rule requirement is met between the second portion of the gate electrode and the at least one contact.

24. The non-volatile semiconductor storage device of claim 17, wherein the anti-fuse further comprises a non-salicide layer formed on the second portion of the gate electrode.

* * * * *